United States Patent
Kumada et al.

(10) Patent No.: US 8,404,314 B2
(45) Date of Patent: Mar. 26, 2013

(54) PLASMA CVD APPARATUS, METHOD FOR FORMING THIN FILM AND SEMICONDUCTOR DEVICE

(75) Inventors: Teruhiko Kumada, Chiyoda-ku (JP); Hideharu Nobutoki, Chiyoda-ku (JP); Naoki Yasuda, Chiyoda-ku (JP)

(73) Assignee: Mitsubishi Electric Corporation, Tokyo (JP)

( * ) Notice: Subject to any disclaimer, the term of this patent is extended or adjusted under 35 U.S.C. 154(b) by 1143 days.

(21) Appl. No.: 12/294,645

(22) PCT Filed: Mar. 23, 2007

(86) PCT No.: PCT/JP2007/055953
§ 371 (c)(1),
(2), (4) Date: Sep. 26, 2008

(87) PCT Pub. No.: WO2007/116644
PCT Pub. Date: Oct. 18, 2007

(65) Prior Publication Data
US 2010/0164072 A1   Jul. 1, 2010

(30) Foreign Application Priority Data
Mar. 29, 2006 (JP) .................................. 2006-092017

(51) Int. Cl.
*C23C 8/00* (2006.01)
*H01L 23/58* (2006.01)
(52) U.S. Cl. ...................................... 427/570; 427/569
(58) Field of Classification Search .................. None
See application file for complete search history.

(56) References Cited

U.S. PATENT DOCUMENTS

| | | | |
|---|---|---|---|
| 5,518,780 A | 5/1996 | Tamor et al. | |
| 6,165,891 A | 12/2000 | Chooi et al. | |
| 6,383,465 B1 | 5/2002 | Matsumoto et al. | |
| 6,458,719 B1 | 10/2002 | Tsunoda et al. | |
| 6,924,240 B2 | 8/2005 | Nobutoki et al. | |

(Continued)

FOREIGN PATENT DOCUMENTS

| | | |
|---|---|---|
| EP | 1 167 291 A1 | 1/2002 |
| JP | 8 41633 | 2/1996 |

(Continued)

OTHER PUBLICATIONS

Matsumoto, JP2001-302218 (as per applicant's IDS), Eng. machine translation of full document.*

(Continued)

*Primary Examiner* — Joseph Miller, Jr.
(74) *Attorney, Agent, or Firm* — Oblon, Spivak, McClelland, Maier & Neustadt, L.L.P.

(57) ABSTRACT

A plasma CVD apparatus including a reaction chamber including an inlet for supplying a compound including a borazine skeleton, a feeding electrode, arranged within the reaction chamber, for supporting a substrate and being applied with a negative charge, and a plasma generating mechanism, arranged opposite to the feeding electrode via the substrate, for generating a plasma within the reaction chamber. A method forms a thin film wherein a thin film is formed by using a compound including a borazine skeleton as a raw material, and a semiconductor device includes a thin film formed by such a method as an insulating film. The apparatus and method enable to produce a thin film wherein low dielectric constant and high mechanical strength are stably maintained for a long time and insulating characteristics are secured.

3 Claims, 3 Drawing Sheets

U.S. PATENT DOCUMENTS

| | | |
|---|---|---|
| 7,029,605 B2 | 4/2006 | Tsunoda et al. |
| 7,192,540 B2 | 3/2007 | Tsunoda et al. |
| 2002/0018025 A1* | 2/2002 | Matsuda et al. ............ 343/895 |
| 2002/0053653 A1 | 5/2002 | Tsunoda et al. |
| 2003/0022494 A1 | 1/2003 | Ying et al. |
| 2004/0159287 A1* | 8/2004 | Hoffman et al. ............ 118/728 |
| 2008/0029027 A1 | 2/2008 | Kumada et al. |
| 2008/0038585 A1 | 2/2008 | Kumada et al. |

FOREIGN PATENT DOCUMENTS

| | | |
|---|---|---|
| JP | 8 339992 | 12/1996 |
| JP | 2000 58538 | 2/2000 |
| JP | 2000 340689 | 12/2000 |
| JP | 2001 302218 | 10/2001 |
| JP | 2001 313335 | 11/2001 |
| JP | 2003 119289 | 4/2003 |
| JP | 2003 273095 | 9/2003 |
| JP | 2004 186649 | 7/2004 |
| JP | 2005 330518 | 12/2005 |
| JP | 2006 32745 | 2/2006 |
| WO | 02 069382 | 9/2002 |
| WO | 2006 043433 | 4/2006 |

OTHER PUBLICATIONS

Kouvetakis, J. Vac. Sci. Technol. A 8 (6), Nov./Dec. 1990, p. 3929-3933.*

Kyoung-Bo Kim, et al., "Adhesion improvement of cubic BN:C film synthesized by a helicon wave plasma chemical vapor deposition process", Journal of Vacuum Science and Technology, vol. 18, No. 3, XP012005068, May 1, 2000, pp. 900-906.

W. F. Kane, et al., "Use of SiBN and SiBON Films Prepared by Plasma Enhanced Chemical Vapor Deposition from Borazine as Interconnection Dielectrics", Journal of the Electrochemical Society, vol. 144, No. 2, XP001161053, Feb. 1, 1997, pp. 658-663.

Office Action issued Dec. 15, 2010 in Taiwanese Application No. 096110467.

* cited by examiner

PLASMA CVD APPARATUS, METHOD FOR FORMING THIN FILM AND SEMICONDUCTOR DEVICE

TECHNICAL FIELD

The present invention relates to a plasma CVD (Chemical Vapor Deposition) apparatus that forms a thin film by using a compound having a borazine skeleton as a raw material. The present invention also relates to a thin-film forming method for forming a thin film by using such a compound having a borazine skeleton as a raw material. Moreover, the present invention relates to a semiconductor device that is provided with a thin film formed by this thin-film forming method as an insulating film.

BACKGROUND ART

Along with the developments of high-speed and highly integrated semiconductor devices, a signal delay has caused a serious problem. The signal delay is represented by the product of the resistance value of wiring and the capacity between wirings as well as between layers, and in order to suppress the signal delay to the minimum, effective methods are to reduce the wiring resistance and also to lower the dielectric constant of an interlayer insulating film.

In recent years, with respect to the method for reducing the dielectric constant of the interlayer insulating film, a method has been proposed in which an interlayer insulating film containing a B—C—N bond is formed on a surface of a subject member by a plasma CVD process in an atmosphere containing a hydrocarbon-based gas, borazine and a plasma-based gas. Moreover, it is also disclosed that the interlayer insulating film exerts a low dielectric constant (see, for example, Patent Document 1 (Japanese Patent Laying-Open No. 2000-058538)).

However, in the above-mentioned conventional method, although a film having a low dielectric constant and high mechanical strength can be formed by using borazine as its material, no consideration is given to the moisture resistance thereof; consequently, when a film that has been formed is left, the film absorbs moisture to cause problems of failures in maintaining the dielectric constant and mechanical strength. Another problem is that the resulting film has a high leak current to cause an insufficient insulating property.

Patent Document 1: Japanese Patent Laying-Open No. 2000-058538

DISCLOSURE OF THE INVENTION

Problems to be Solved by the Invention

The present invention has been devised to solve the above-mentioned technical problems, and an objective thereof is to provide a plasma CVD apparatus and a thin-film forming method that can produce a thin film wherein low dielectric constant and high mechanical strength are stably maintained for a long time and insulating characteristics are secured.

Means for Solving the Problems

A plasma CVD apparatus according to the present invention is provided with: a reaction chamber having an inlet used for supplying a compound having a borazine skeleton; a feeding electrode, arranged within the reaction chamber, for supporting a substrate and being applied with a negative charge; and plasma generator, arranged opposite to the feeding electrode via the substrate, for generating a plasma within the reaction chamber.

Moreover, a thin-film forming method according to the present invention is provided with the steps of: introducing a compound having a borazine skeleton into a reaction chamber; applying a negative charge to a feeding electrode that supports a substrate placed inside the reaction chamber; generating a plasma inside the reaction chamber by using a plasma generator arranged opposite to the feeding electrode via the substrate so that the compound is excited; and sweeping the excited compound by the negative charge to be successively bonded to one another so that the resulting polymerized compound is deposited on the substrate.

Furthermore, a semiconductor device according to the present invention is provided with an insulating film formed on a substrate by using the thin-film forming method of the present invention, with wiring being further installed thereon.

Effects of the Invention

The plasma CVD apparatus of the present invention makes it possible to provide a thin film wherein low dielectric constant and high mechanical strength are stably maintained for a long time and insulating characteristics are secured. Moreover, the thin-film forming method of the present invention makes it possible to form a thin film wherein low dielectric constant and high mechanical strength are stably maintained for a long time and insulating characteristics are secured. Furthermore, the semiconductor device of the present invention makes it possible to suppress a signal delay to a minimal level, and consequently to achieve a high speed device.

DESCRIPTION OF THE REFERENCE SIGNS

1 Reaction chamber, 4 Vacuum pump, 5 Material inlet, 7 Feeding electrode, 8 Substrate, 9 Antenna, 10 DC power supply, 11 Plasma, 12 Plasma generator, 13 Microwave generator, 14 Waveguide tube, 15 Coil, 16 Microwave guide window, 21, 22 High frequency power supply, 31, 32 Matching device, 61 Heating device, 62 Heating/cooling device, 101, 102, 103 Earthed electrode, 501 Semiconductor substrate, 502, 509 Insulating film, 503 First insulating layer, 504 First conductor layer, 505 Second insulating layer, 506 Second conductor layer, 507 Third insulating layer, 508 Third conductor layer

BEST MODES FOR CARRYING OUT THE INVENTION

Embodiment 1

Figure 1:
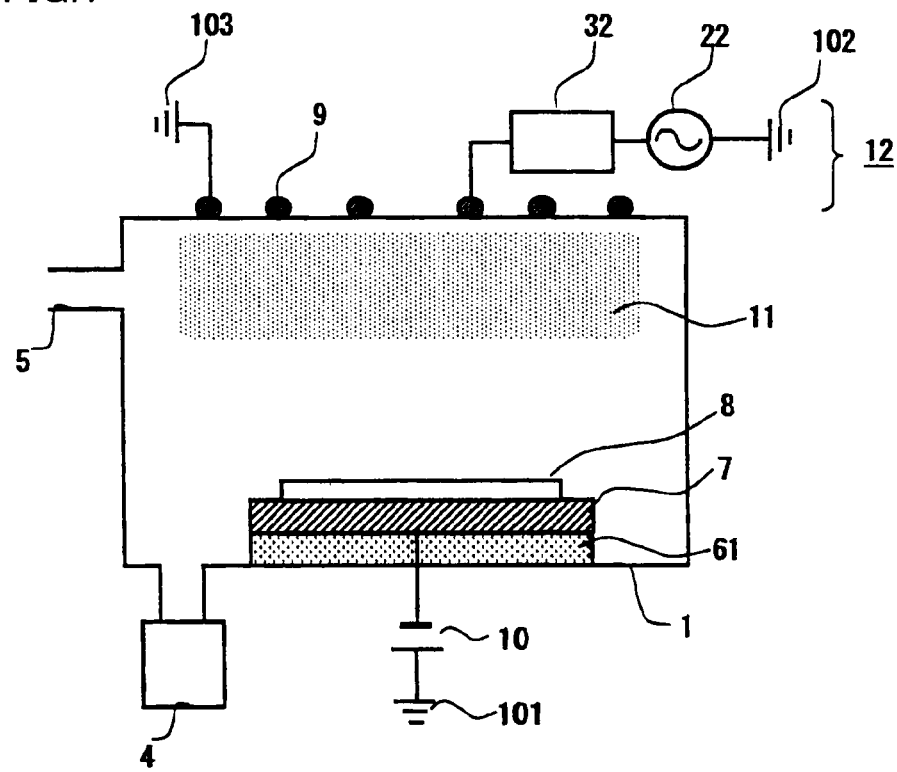
FIG. 1 is a schematic view that shows one example of a schematic structure of a PCVD apparatus in accordance with Embodiment 1 of the present invention.

FIG. 1 is a schematic view that shows a schematic structure of a plasma CVD apparatus (hereinafter, referred to as a PCVD apparatus) in accordance with Embodiment 1 of the present invention. As shown in FIG. 1, the PCVD apparatus in accordance with the present invention is provided with a reaction chamber having a vacuum pump 4 and a material inlet 5 used for supplying a compound having a borazine skeleton, a feeding electrode 7 that is installed in reaction chamber 1 to support a substrate 8, and that is applied with a negative charge, and a plasma generator 12 that is arranged opposite to feeding electrode 7 via substrate 8 so as to generate a plasma 11 within reaction chamber 1.

In the PCVD apparatus of the present invention, a compound having a borazine skeleton is introduced into reaction chamber 1, with a plasma being generated within reaction chamber 1 by plasma generator 12 placed opposite to feeding electrode 7, so that the compound is excited, and by further applying a negative charge to feeding electrode 7, the excited compound is swept toward substrate 8 side, and successively bonded to one another to be polymerized and deposited on substrate 8.

Plasma generator 12 may be configured by a high frequency power supply 22, a matching device 32 and an antenna 9 having a winding coil structure. A high frequency energy, generated by high frequency power supply 22, is adjusted by matching device 32, and propagated into reaction chamber 1 by antenna 9 so that a material gas and the like inside reaction chamber 1 are excited to generate a plasma. A magnetic field is generated by antenna 9 having the winding coil structure, and by resonating the magnetic field, the plasma density may be increased. Moreover, by changing the shape of antenna 9, the plasma generating position may be changed. Here, one portion of the above-mentioned structure may be omitted depending on circumstances. Moreover, for safety, earthed electrodes 102 and 103 are preferably installed.

With respect to the method for applying a negative charge to feeding electrode 7, for example, it is performed by connecting a DC power supply 10 to feeding electrode 7. For safety, earthed electrode 101 is preferably installed. The voltage of DC power supply 10 is preferably set to 1500 V or less. When the voltage exceeds 1500 V, the borazine skeleton in a film formed on substrate 8 is damaged, and a component that causes a high dielectric constant, such as boron nitride, is consequently generated, with the result that the leak current of the film increases to impair the insulating characteristic.

By providing a PCVD apparatus having the above-mentioned structure, it becomes possible to give a desired plasma energy uniformly to the compound having a borazine skeleton that has been introduced into reaction chamber 1 through material inlet 5, by using plasma generator 12.

The compound to which the plasma energy has been given is brought into a reaction active state, with the borazine skeleton being maintained therein, and it is consequently drawn toward substrate 8 by a dc electric field applied to feeding electrode 7, with its reaction active state being maintained, so that the active component is sufficiently subjected to a crosslinking reaction. Moreover, since the adjustment of plasma energy is easily carried out, the borazine skeleton is prevented from being decomposed beyond a necessary level so that a desired structure can be maintained. With this arrangement, it is possible to obtain a film that ensures a low dielectric constant, high mechanical strength and sufficient moisture resistance. It is also possible to maintain superior characteristics even after age-based changes. Moreover, it is possible to prevent excessive generation of boron nitride due to an excessive decomposition, and consequently to suppress a high dielectric constant and degradation in leak current characteristics of the film.

The high frequency generated by the above-mentioned high frequency power supply 22 is set to, for example, 13.56 MHz, and is desirably set within a range from 2 GHz to 4 kHz. Moreover, the power is desirably set in a range from 5 to 4000 W. In a case where the power exceeds 4000 W, the decomposing frequency of a compound having a borazine skeleton increases, making it difficult to obtain a desirable borazine skeleton. Preferably, the power is set from 10 W or more to 3000 W or less. RF (10 kHz to 1 GHz) or microwaves (1 GHz to 10 GHz) may be used as the high frequency to be applied. Here, a plurality of frequencies may be combined.

Figure 2:
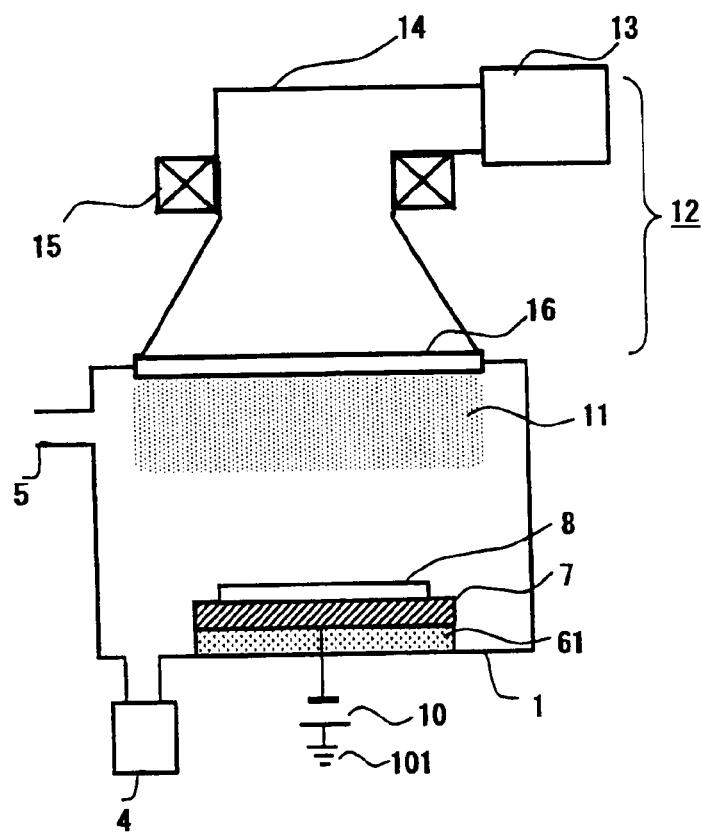
FIG. 2 is a schematic view that shows another example of a schematic structure of a PCVD apparatus in accordance with Embodiment 1 of the present invention.

Plasma generator 12 may have a structure as shown in FIG. 2. Microwaves, generated by microwave generator 13, are propagated through a waveguide tube 14, and further propagated to the inside of reaction chamber 1 through microwave guide window 16 to be given to a material gas so that a plasma is generated. The plasma density may be increased by generating a magnetic field from coil 15.

Moreover, by further attaching a heating device 61 to feeding electrode 7, the film deposited by heat is further crosslinked to be highly polymerized; thus, it is possible to improve the heat resistance of the film. The heat crosslinking process makes it possible to reduce outgas generated from a film after the film forming process, and consequently to reduce limitations in the succeeding processes; therefore, the process is preferably used. Upon heating substrate 8, the material gas temperature and the substrate temperature are preferably controlled within a range from room temperature to 450° C. In a case where the material gas and the substrate temperature exceed 450° C., it takes an extremely long period of time to obtain a desired film thickness, with the result that it sometimes becomes difficult to execute the film forming process smoothly. The temperatures are preferably set in a range from 50° C. or more to 400° C. or less.

Figure 3:
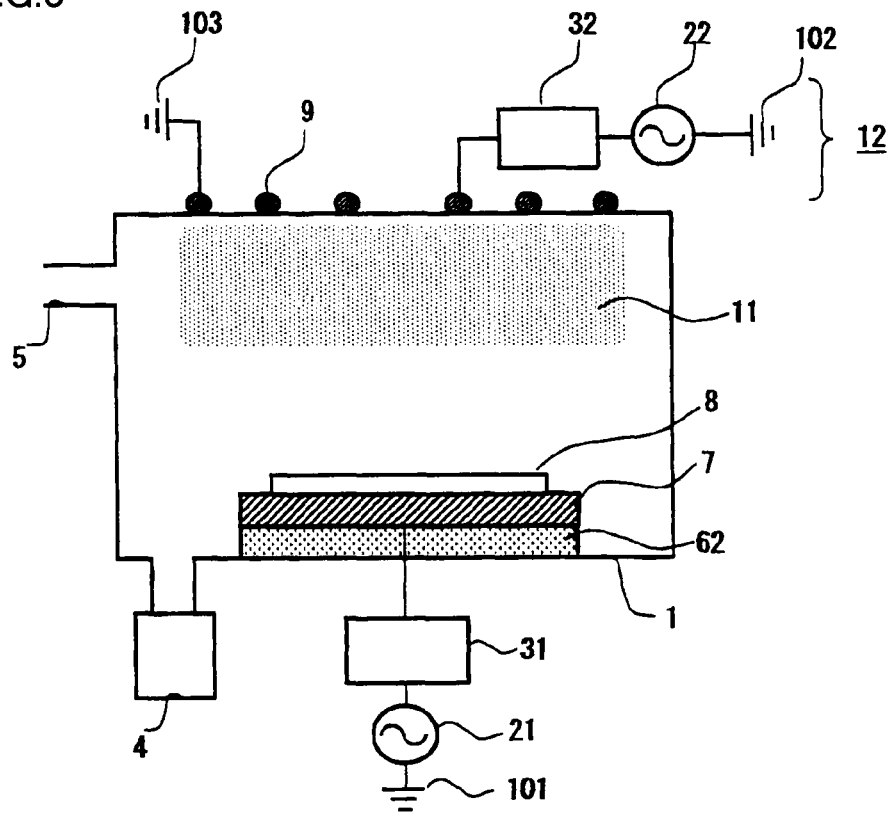
FIG. 3 is a schematic view that shows still another example of a schematic structure of a PCVD apparatus in accordance with Embodiment 1 of the present invention.

Control of the above-mentioned substrate temperature may be carried out by on-off operations of heating device 61, or by using a heating/cooling device 62, as shown in FIG. 3, that also has a cooling function instead of heating device 61, the substrate may be set to a predetermined process temperature.

Feeding electrode 7 on which substrate 8 is placed may be prepared as a plasma source used for inducing plasma. More specifically, as shown in FIG. 3, a power supply may be configured by a high frequency power supply 21 in which a negative charge is multiplexed and a matching device 31. Since this structure makes it possible to control an activating reaction on the surface of substrate 8 by using a plasma on the substrate 8 side, the film quality can be controlled. With respect to the high frequency generated by high frequency power supply 21, for example, 13.56 MHz may be used, and RF (10 kHz to 1 GHz) or microwaves (1 GHz to 10 GHz) may be used as the high frequency. A plurality of frequencies may be combined with one another. The power is preferably set to 3000 W or less. When the power exceeds 3000 W, the borazine skeleton in the film formed on substrate 8 is damaged, and a component that causes a high dielectric constant, such as boron nitride, is consequently generated, with the result that the leak current of the film increases to impair the insulating characteristic.

The introduction of a compound having a borazine skeleton into reaction chamber 1 may be carried out by directing the corresponding compound in a gas state, as it is, thereto through material inlet 5, or may be carried out by processes in which the corresponding compound is evaporated by using a heating evaporator mechanism or the like attached separately, and directed thereto. In a case where by heating a material storage container, the compound having a borazine skeleton is evaporated, the gas may be introduced by utilizing this evaporating pressure. A gas, such as Ar, He, nitrogen or the like may be used as a carrier gas. The characteristics of the film may be controlled by mixing methane, ethane, ethylene, acetylene, ammonia or a compound of any of alkyl amines therewith.

The flow rate of the carrier gas is preferably set in a range from about 100 to about 1000 sccm, the gas flow rate of a material compound having a borazine skeleton is preferably set in a range from 1 to 300 sccm, and the flow rate of methane, ethane, ethylene, acetylene, ammonia or alkyl amines to be added is preferably set in a range from 0 to about 100 sccm. In a case where the flow rate of the carrier gas is less than 100 sccm, it takes an extremely long period of time to obtain a desired film thickness, with the result that it sometimes becomes difficult to execute the film forming process smoothly. Moreover, in a case where the flow rate exceeds 1000 sccm, the evenness of the film thickness within the substrate face tends to deteriorate. The flow rate is more preferably set in a range from 200 sccm or more to 800 sccm or less.

In a case where the flow rate of the material gas is less than 1 sccm, it takes an extremely long period of time to obtain a desired film thickness, with the result that it sometimes becomes difficult to execute the film forming process smoothly. Moreover, when the flow rate exceeds 300 sccm, the resulting film has a low crosslinking density to cause a reduction in mechanical strength. The flow rate is preferably set from 5 sccm or more to 200 sccm or less. Upon addition of methane, ethane, ethylene, acetylene, ammonia or a gas of any of alkyl amines, the flow rate exceeding 100 sccm causes an increase in the dielectric constant of the resulting film. More preferably, the flow rate is set from 5 sccm or more to 100 sccm or less.

Moreover, the pressure of reaction chamber 1 is preferably set to 0.01 Pa or more to 10 Pa or less. In a case where the pressure is less than 0.01 Pa, the decomposing frequency due to plasma of a compound having a borazine skeleton increases, making it difficult to obtain a desirable borazine skeleton. The pressure exceeding 10 Pa causes a film having a low crosslinking density and the subsequent reduction in the mechanical strength. More preferably, the pressure is set to 5 Pa or more to 6.7 Pa or less. The pressure may be adjusted by a pressure adjusting device, such as a vacuum pump, or the gas flow rate.

Moreover, a partition plate that can sweep ions and block radicals may be formed on substrate 8. The radical components in the film absorb moisture after the film formation to give adverse influences to the moisture resistance of the film. By installing the partition plate, it becomes possible to restrain the radical components from being incorporated in the film.

The present embodiment has exemplified a structure in which feeding electrode 7 is installed on the lower portion of reaction chamber 1, with plasma generator 12 being installed on the upper portion thereof; however, the present invention is not intended to be limited by this structure, as long as feeding electrode 7 and plasma generator 12 are placed opposite to each other. For example, the upside-down reversed structure may be used, or these may be placed on side faces of reaction chamber 1.

Embodiment 2

The following description will discuss a film-forming process in which the PCVD apparatus in accordance with Embodiment 1 is used. First, substrate 8 is placed on feeding electrode 7, and the inside of reaction chamber 1 is vacuum-drawn. Next, a material gas (a compound having a borazine skeleton), a carrier gas and other gases, if necessary, are supplied into reaction chamber 1 through gas inlet 5. Moreover, the pressure inside reaction chamber 1 is vacuum-drawn by vacuum pump 4 to be maintained at a predetermined process pressure. Here, substrate 8 is set to a predetermined process temperature by using heating device 61 or heating/cooling device 62.

Moreover, when a high frequency is generated by high frequency power supply 22 so that plasma 11 is generated inside reaction chamber 1, the material gas (composition having a borazine skeleton) and the carrier gas are formed into ions and radicals in reaction chamber 1. Of these, the ions are drawn by the electrode having a potential reversed to the charge of their own, and collide therewith repeatedly to react with each other. When a negative charge is applied to feeding electrode 7 at this time, cations are selectively drawn onto the feeding electrode 7 side, and a film is subsequently formed so that it is possible to reduce the rate of anions and radicals devoting to the film formation.

Here, since the radicals are distributed uniformly in the plasma field, reactions mainly caused by cations are allowed to take place on substrate 8 placed on feeding electrode 7. Therefore, it becomes possible to restrain radicals from depositing on substrate 8, and consequently to reduce the amount of radicals in the film thus formed.

When borazine radicals remain in the film, B-hydroxy borazine is generated by reactions with oxygen and water. When this is released into the air, it reacts with water to generate boroxine and ammonia, with the result that one portion of the film tends to be easily damaged. That is, the film characteristics tend to change with time, or outgas tends to be generated. As described above, in the thin-film forming method according to the present invention, since radicals in the film can be reduced, it becomes possible to restrain the radical components and moisture in the air from reacting with each other in the film that has been formed. Thus, it becomes possible to provide a film that is superior in moisture resistance and can maintain stable characteristics even after a lapse of time. More specifically, in comparison with a film formed by a conventional thin-film forming method that can maintain a dielectric constant in a range from 3.0 to 1.8 only for several days, a film, formed by using the thin-film forming method in accordance with the present invention, makes it possible to maintain the corresponding dielectric constant for at least several years. Here, such a low dielectric constant can be confirmed by measuring the dielectric constant of a film that has been preserved for a predetermined period of time by using the same method as the method used immediately after the film formation.

Moreover, since a film formed by using the thin-film forming method according to the present invention hardly contains excessively decomposed matters of boron nitride or the like in comparison with a film formed by using a conventional thin-film forming method, it is possible to achieve a lower dielectric constant. Moreover, since the amount of outgas is reduced, another advantage is that no problems arise in the succeeding semiconductor device manufacturing processes after the film formation.

In the thin-film forming method according to the present invention, with respect to the compound having a borazine skeleton to be used as a raw material, any conventionally known compound may be used without limitations as long as it has a borazine structure, and in particular, from the viewpoint of manufacturing a film in which the dielectric constant, thermal expansion coefficient, heat resistance, thermal conductivity and mechanical strength are improved, a compound indicated by the following formula (I) is preferably used as the raw material.

Chemical Formula 1

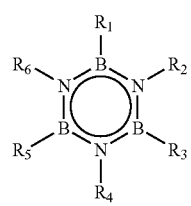

(1)

In the compound indicated by the above-mentioned chemical formula (I), substituents indicated by $R_1$ to $R_6$ may be the same or different from one other, and any of a hydrogen atom or an alkyl group, an alkenyl group or an alkynyl group having carbon atoms of 1 to 4, may be used as those substituents independently. However, all the $R_1$ to $R_6$ are not hydrogen atoms. When all the $R_1$ to $R_6$ are hydrogen atoms, boron-hydrogen bonds or nitrogen-hydrogen bonds tend to remain in a film. Since these bonds have a high hydrophilic property, a problem tends to arise in that the moisture absorbing property of the film becomes higher to cause a failure to provide a desired film. Moreover, in $R_1$ to $R_6$ of the above-mentioned compound (I), when the number of carbon atoms exceeds 4, the content of carbon atoms in the film thus formed becomes higher to cause the possibility of degradation in the heat resistance and mechanical strength in the film. The number of carbon atoms is preferably set to 1 or 2.

Embodiment 3

Figure 5:
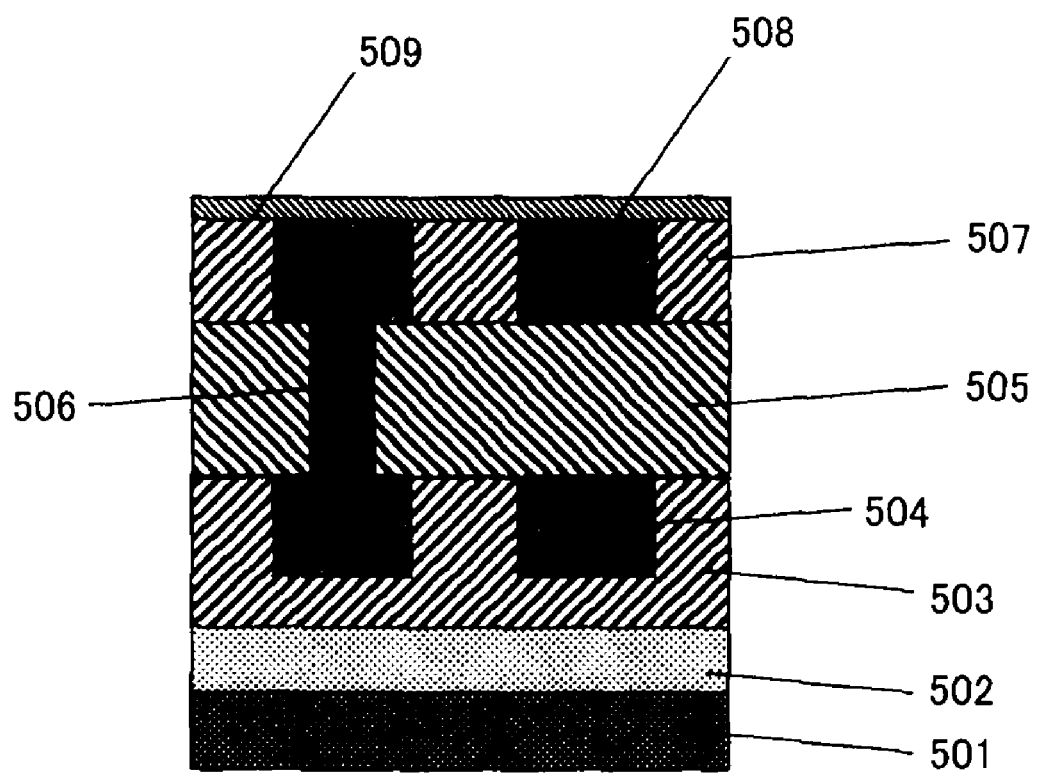
FIG. 5 is a schematic cross-sectional view that shows one example of a semiconductor device in accordance with Embodiment 3 of the present invention.

By using the PCVD apparatus shown in the above-mentioned Embodiment 1, a film formed by the thin-film forming method shown in the above-mentioned Embodiment 2 was used as an insulating layer and a wiring pattern made of copper was formed thereon, and these processes were repeated so that a semiconductor device having several laminated layers was manufactured. FIG. 5 is a schematic cross-sectional view showing one example of the semiconductor device. Insulating films 502 and 509, a first insulating layer 503, a second insulating layer 505 and a third insulating layer 507 were formed by using the PCVD apparatus shown in the above-mentioned Embodiment 1 through the thin-film forming method in accordance with the above-mentioned Embodiment 2. In the above-mentioned semiconductor device, it was confirmed that wiring delay could be reduced in comparison with the structure in which the insulating layers were made from silicon oxide or silicon nitride. Moreover, it was also confirmed that no changes in the signal velocity occurred even after a lapse of one month. Furthermore, when used as a passivation film for a HEMT (High Electron Mobility Transistor) using a gallium arsenide substrate that is one of high-frequency devices, it was confirmed that the signal gain performance could be improved.

The following description will discuss the present invention in detail by means of Examples; however, the present invention is not intended to be limited thereby.

Examples 1 to 3

By using the PCVD apparatus shown in FIG. 1, the following film forming processes were carried out. Helium, serving as a carrier gas, was loaded into reaction chamber 1, with a flow rate being set to 200 sccm. Moreover, a B,B,B,N,N,N-hexamethyl borazine gas having a flow rate of 10 sccm was introduced into reaction chamber 1 in which substrate 8 was placed through material inlet 5 that had been heated. The vapor temperature of the B,B,B,N,N,N-hexamethyl borazine gas was set to 150° C. Substrate 8 was heated by a heating device 61 to a temperature of 300° C., and a dc electric field of −600 V to −200 V (Examples 1 to 3) was applied to feeding electrode 7 supporting substrate 8 by DC power supply 10. Furthermore, a high frequency of 13.56 MHz was directed thereto through an antenna 9 at 1000 W so that a plasma 11 was generated; thus, the activated material gas was deposited so that a film was formed. Here, the pressure inside the reaction chamber was maintained at 2 Pa.

Comparative Example 1

A film forming process was carried out with no dc electric field (0 V) being applied to feeding electrode 7. The other conditions are the same as those of the above-mentioned Examples 1 to 3.

Figure 4:
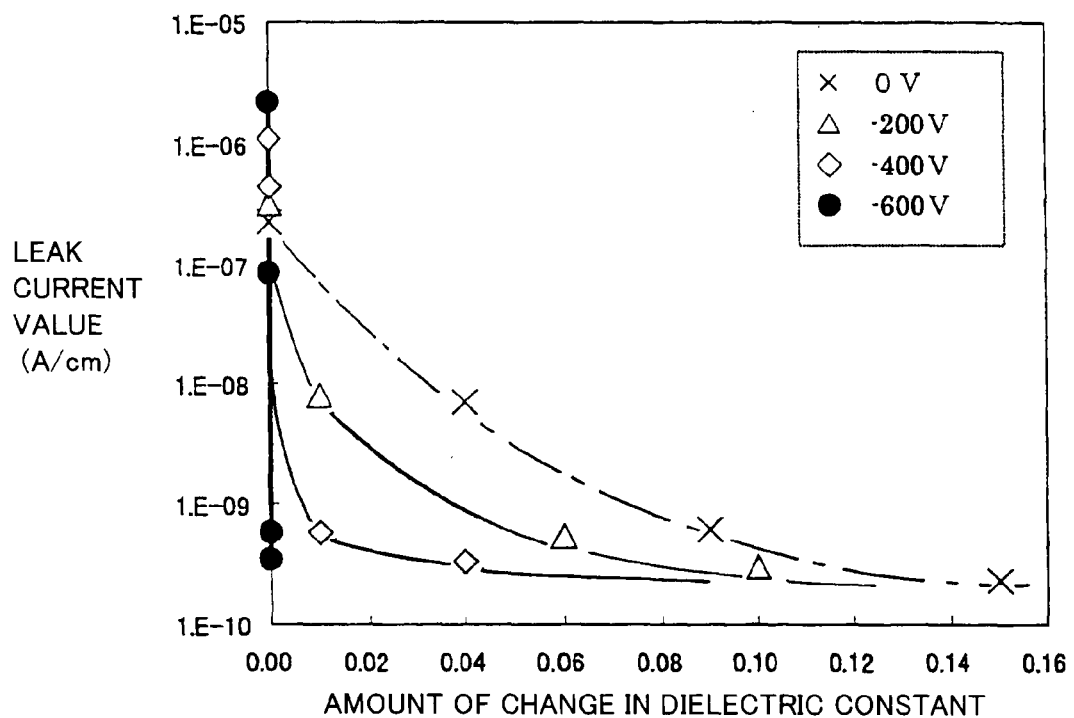
FIG. 4 is a characteristic view that shows the relationship between a leak current value and an amount of change in dielectric constant in Examples 1 to 3 and Comparative Example 1.

In the above-mentioned Examples 1 to 3 and Comparative Example 1, the applied power from high frequency power supply 22 was varied in a range from 250 to 1500 W respectively, and the amount of change in dielectric constant after having been set aside for 96 hours under the atmosphere of 85° C. with 85% in moisture and the leak current value upon application of an electric field of 2 MV/cm were respectively measured; thus, the results are summarized in Table 1. Moreover, the relationship between the leak current value and the amount of change in dielectric constant is shown in FIG. 4.

TABLE 1

| | Electric field (V) | Power (W) applied from high frequency power supply | Amount of change in dielectric constant Change in dielectric constant after having been set aside for 96 hours under the atmosphere of 85° C. with 85% in moisture. | Leak electric current (A/cm) Upon application of electric field of 2 MV/cm |
|---|---|---|---|---|
| Comparative Example 1 | 0 | 250 | 0.15 | 2.30E−10 |
| | | 500 | 0.09 | 6.10E−10 |
| | | 1000 | 0.04 | 7.20E−09 |
| | | 1500 | 0 | 2.20E−07 |
| Example 1 | −200 | 250 | 0.1 | 3.00E−10 |
| | | 500 | 0.06 | 5.50E−10 |
| | | 1000 | 0.01 | 8.00E−09 |
| | | 1500 | 0 | 3.20E−07 |

TABLE 1-continued

|  | Electric field (V) | Power (W) applied from high frequency power supply | Amount of change in dielectric constant Change in dielectric constant after having been set aside for 96 hours under the atmosphere of 85° C. with 85% in moisture. | Leak electric current (A/cm) Upon application of electric field of 2 MV/cm |
|---|---|---|---|---|
| Example 2 | −400 | 250 | 0.04 | 3.30E−10 |
|  |  | 500 | 0.01 | 5.70E−10 |
|  |  | 1000 | 0 | 1.10E−06 |
|  |  | 1500 | 0 | 4.40E−07 |
| Example 3 | −600 | 250 | 0 | 3.40E−10 |
|  |  | 500 | 0 | 5.80E−10 |
|  |  | 1000 | 0 | 8.40E−08 |
|  |  | 1500 | 0 | 2.20E−06 |

Table 1 indicates that when the applied power from high frequency power supply 22 is raised, the amount of change in dielectric constant corresponding to the amount of change with time can be reduced. However, this also indicates that under the condition that the amount of change in dielectric constant can be reduced, the leak current value increases to cause degradation in the film insulating characteristic. Here, upon consideration on the relationship between the leak current value and the amount of change in dielectric constant in FIG. 4, it is found that by applying a dc electric field (Examples 1 to 3), the amount of change in dielectric constant can be reduced. Moreover, it is found that desirable conditions can be set within ranges of the applied voltage of −600 V to −200 V and the applied power of 250 to 1500 W. In other words, in Examples 1 to 3, it is possible to achieve an amount of change in dielectric constant of 0.05 or less and a leak current value of 1.0 E-9 A/cm or less. By using more appropriate conditions, it is also possible to achieve a more preferable amount of change in dielectric constant of 0.02 or less and a leak current value of 1.0 E-9 A/cm or less. That is, it is possible to form a film that is superior in insulating characteristic (having a good moisture resistance) with little change with time.

It is to be understood that while the embodiments and examples disclosed above illustrate the present invention, they are exemplary only and not restrictive. The scope of the present invention is indicated not by the above-mentioned description, but by the following claims, and variations are not to be regarded as a departure from the spirit and scope of the invention, and all such modifications are intended to be included within the scope of the following claims.

The invention claimed is:

1. A thin-film forming method comprising:
introducing a compound having a borazine skeleton into a portion above a substrate placed inside a reaction chamber;
applying a negative charge to a feeding electrode that supports said substrate placed inside said reaction chamber;
generating a plasma inside said reaction chamber by generating a high frequency energy using a plasma generator arranged opposite to said feeding electrode via said substrate so that at the portion above said substrate said compound is brought into a reaction active state with the borazine skeleton being maintained therein; and
selectively sweeping cations out of the active components of said compound in said reaction active state onto said substrate by said negative charge applied to said feeding electrode and successively bonding the borazine skeletons of said cations to a film on said substrate and polymerizing the borazine skeletons to be deposited on said substrate,
wherein said compound having a borazine skeleton is indicated by the following Formula (1):

Formula (1)

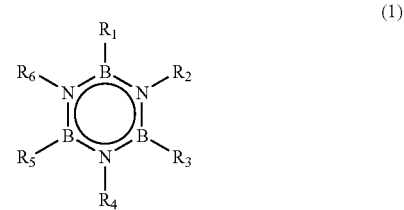

(1)

in which $R_1$ to $R_6$ are identical or different from one other, and respectively selected from the group consisting of a hydrogen atom, and an alkyl group, an alkenyl group and an alkynyl group each having carbon atoms of 1 to 4, independently, with at least one of $R_1$ to $R_6$ being not a hydrogen atom,
wherein the voltage applied to the feeding electrode is −600V to −200V and a power of the high frequency energy generated by the plasma generator is 250 to 1500 W.

2. The thin-film forming method according to claim 1, further comprising:
heating and crosslinking a film formed of the polymerized the borazine skeletons to be deposited on said substrate.

3. The thin-film forming method according to claim 1, wherein the film on said substrate is activated by plasma induction using a high frequency power supply connected to said feeding electrode, and the borazine skeleton brought into the reaction active state above said substrate is successively bonded to the film activated by said plasma induction and polymerized.

* * * * *